AMPLIFIER CIRCUIT WITH SEMICONDUCTOR DEVICE
Filed April 25, 1966
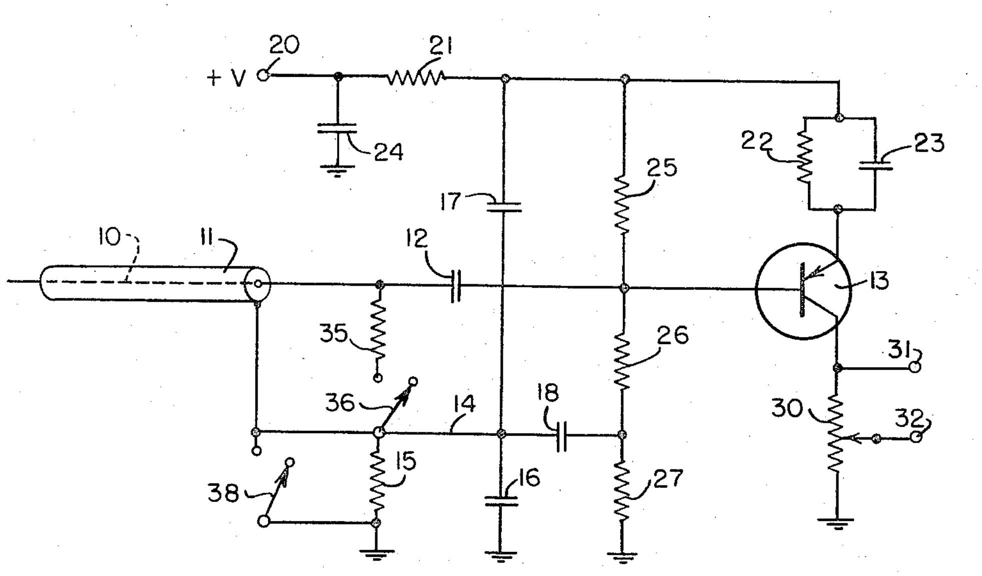
INVENTOR
PAUL J. CARLSON
BY
Mueller, Aichele & Rauner
ATTYS.

United States Patent Office 3,418,593
Patented Dec. 24, 1968

3,418,593

AMPLIFIER CIRCUIT WITH SEMICONDUCTOR DEVICE

Paul J. Carlson, River Grove, Ill., assignor to Motorola, Inc., Franklin Park, Ill., a corporation of Illinois
Filed Apr. 25, 1966, Ser. No. 544,941
8 Claims. (Cl. 330—40)

This invention relates to differential amplifiers, and more particularly to a differential amplifier for amplifying the signals between a pair of conductors of a transmission line wherein the potential on the reference conductor varies with respect to ground.

There are many applications wherein it is desired to amplify a signal applied over a transmission line and wherein the reference conductor of the transmission line is not at a fixed potential. One such application is the connection of a video monitor in a closed circuit television system, wherein signals are applied to the monitor through a long coaxial cable. Hum signals may develop in the reference conductor by induction and/or through ground potential variance, so that a substantial signal appears between the reference conductor and ground. It is, therefore, desired to derive the signal which appears between the conductors and provide an output signal with reference to ground. Since the video signal has a wide bandwidth, the differential amplifier must have a correspondingly wide frequency response.

Prior differential amplifiers have used at least two transistors or other active elements. This has resulted in circuits which involved significant cost. The number of transistors and other elements required by the circuits has rendered the circuits unnecessarily complex.

It is, therefore, an object of this invention to provide a simple amplifier circuit which responds to the signal appearing between two input conductors, but not to a signal appearing between the input conductors and ground.

Another object of the invention is to provide a differential amplifier circuit which requires only a single active element.

A feature of the invention is the provision of a differential amplifier which responds to the signal on one conductor of a transmission with respect to a second conductor of the line, wherein the signal on the second conductor is applied to the base and emitter electrodes to form a reference and the signal on the first conductor is applied to the base electrode and controls conduction in the emitter-collector circuit of the transistor.

A further feature of the invention is the provision of a differential amplifier for providing an output signal with respect to ground in response to an input signal applied between the center and the outer conductors of a transmission line, with the AC signal on the outer conductor being applied to the base and emitter electrodes of the transistor to form a reference therefor, and the signal on the center conductor being applied to the base electrode. A constant current supply provides current in the emitter-collector circuit of the transistor and a load impedance is connected between the collector electrode and the reference potential, so that the signal across the load impedance depends upon the voltage between the center and outer conductors.

The invention is illustrated in the drawing wherein the single figure is a circuit diagram of one embodiment of the differential amplifier of the invention.

The differential amplifier of the invention includes a transistor to the base electrode of which is applied the signal from one conductor of a transmission line. The signal on the shield or reference conductor is applied to the bias circuits coupled to the emitter and base electrodes so that the transistor responds to the signal between the two conductors. Current is supplied to the emitter-collector circuit of the transistor from a constant current source and the load impedance is connected between the collector and the reference potential so that the output signal is derived with respect to the reference potential. The output signal varies with the signals between the two conductors and is independent of the signals between the input conductors and ground, when the signals between the conductors and ground are the same. The differential amplifier has a wide band frequency response so that it can be used for video signals and the like.

Referring now to the drawing, a differential amplifier is shown for connection to a coaxial cable having a center conductor 10 and an outer conductor or shield 11. The cable may be relatively long and susceptible to hum pickup by induction therein, or through ground potential changes. The signal on the center conductor 10 includes the signal between the center conductor and the outer conductor 11 as well as the signal between the outer conductor 11 and ground. This signal is applied through capacitor 12 to the base electrode of transistor 13. The signal on the outer conductor or shield 11 is applied to conductor 14 which is connected to ground by resistor 15 and capacitor 16. Resistor 15 provides a discharge path for static potential on the shield. Capacitor 16 bypasses high frequency signal components which would be otherwise coupled from the amplifier to the incoming line and could be a source of interference to any other circuits which may be in proximity to the transmission line. Where this possibility of interference is not objectionable, capacitor 16 may be omitted, and the amplifier will then be capable of rejecting high frequency interference more effectively. Capacitor 16 does not affect the low frequency rejection ability significantly. The resistor 15 is large enough that the current which flows therein, and through the shield, is of low value. The signal on conductor 14 is coupled by capacitor 17 to the emitter electrode of transistor 13, and through capacitor 18 to the base bias supply point.

Bias potential is applied from the positive potential terminal 20 through resistors 21 and 22 to the emitter electrode. Capacitor 23 is connected across resistor 22 to compensate the response to provide the desired frequency bandwidth. The signal on the shield is applied to the bias circuit, being coupled from conductor 14 through capacitor 17 and through resistor 22 and capacitor 23 in parallel to the emitter electrode. The voltage divider including resistors 25, 26 and 27 provides bias potential from terminal 20 to the base electrode of transistor 13. Capacitor 18 applies the signal on the shield across resistor 27, so that the alternating current component of this signal is added to the base bias. The signal on the shield is therefore applied in the same phase and amplitude to the emitter and base electrodes of transistor 13, so that it does not affect the collector current.

Load resistor 30 is connected between the collector electrode of transistor 13 and ground. Resistor 21 has a large value so that the current therethrough is essentially constant, and the collector circuit of the transistor has a constant current characteristic so that the voltage developed across the load resistor 30 is controlled by the signal between the conductors. The signal applied to the base electrode includes both the signal between the center and outer conductors, and also the potential variation on the outer conductor. However, since the signal on the outer conductor is also applied to the emitter electrode, this serves as a reference and the collector current depends essentially on the signal between the two conductors.

The output signal can be derived from terminal 31 connected to the collector of transistor 13 and/or from terminal 32 connected to a variable tap which engages the resistor 30. This provides a control of the signal as may be required for contrast control in a closed circuit television system.

A termination resistor 35 is connected in series with switch 36 between the center conductor 10 and the output conductor 11 of the transmission line. By closing the switch 36, the resistor 35 is connected to terminate the line. The resistor may have a value of 75 ohms when used with a 75 ohm coaxial transmission line. Switch 38 is connected to short out the resistor 15 to ground the outer conductor. When the switch 38 is closed, the shield is connected directly to ground so that the differential action is eliminated. In such case, the amplifier operates as a common emitter amplifier circuit and responds to the signal between the center conductor 10 of the transmission line and ground.

The amplifier of the invention has been found to be highly effective for deriving signals from a long line. The amplifier requires only a single transistor and the other components required are all inexpensive. The amplifier provides an output responsive to the signal appearing between the two conductors of the line, and independent of any signals between the conductors and ground.

I claim:

1. An amplifier for amplifying signals appearing between first and second conductors of a transmission line and wherein the potential of both conductors varies substantially the same with respect to a reference potential, said amplifier including in combination, a transistor having base, emitter and collector electrodes, a load impedance connecting said collector electrode to said reference potential, bias circuit means having a first portion connected to said emitter electrode and applying direct current thereto and a second voltage divider portion connected to said base electrode for applying a direct current bias potential thereto, first alternating current coupling means connecting the first conductor to said base electrode, and second alternating current coupling means including first and second portions for coupling the second conductor to said first and second portions of said bias circuit means for applying the potential on said second conductor to said emitter and base electrodes of said transistor, so that the signal between the first and second conductors controls the conduction of said transistor and thereby controls the signal developed in said load impedance.

2. The amplifier of claim 1 wherein said first portion of said bias circuit means includes means for applying a substantially constant current to said emitter electrode.

3. The amplifier of claim 1 wherein said first portion of said bias circuit means includes a parallel resistance-capacitance circuit for compensating the frequency response of the amplifier.

4. The amplifier of claim 1 further including resistor means connected between the second conductor and the reference potential for removing the static potential on the second conductor, and switch means for bypassing said resistor means so that the signal developed in said load impedance represents the signal between the first conductor and the reference potential.

5. An amplifier for amplifying signals between a signal conductor and a reference conductor of a transmission line, and wherein the signal of the conductors varies with respect to a fixed potential point, said amplifier including a transistor having base, emitter and collector electrodes, a load impedance connecting said collector electrode to said fixed potential point, a bias circuit having a first portion connected to said emitter electrode and a second portion connected to said base electrode, said first portion of said bias circuit including means for applying a constant current to said emitter electrode and means for compensating the frequency response to render the same more uniform, said second portion of said bias circuit including a voltage divider for applying a direct current potential to said base electrode, first input means for connection to the signal conductor and including a first capacitor for coupling signals to said base electrode, and second input means for connection to the reference conductor and including first and second capacitors for coupling the signals on the reference conductor to said first and second portions of the bias circuit respectively for applying the alternating current component of the signal on the reference conductor to said emitter and base electrodes of said transistor, so that the signal between the signal and reference conductors controls the conduction of said transistor and thereby controls the signal developed in said load impedance, and said load impedance provides an output signal with respect to said fixed potential point.

6. The amplifier of claim 5 wherein said second capacitor applies the alternating current component of the signal on the reference conductor across a portion of said voltage divider.

7. The amplifier of claim 5 wherein said means for compensating the frequency response includes a resistor and capacitor connected in parallel, and said first capacitor is connected in series with said compensating means from the reference conductor to said emitter electrode.

8. The amplifier of claim 5 including resistor means and capacitor means connected in parallel from said second input means to the fixed potential point, with said resistor means providing a discharge path for static potentials on the reference conductor and said capacitor means providing a bypass for high frequency signal components to prevent transmission of such components to the reference conductor.

No references cited.

NATHAN KAUFMAN, *Primary Examiner.*

U.S. Cl. X.R.

307—235; 325—475, 493; 328—265; 330—30, 53, 69, 185